(12) United States Patent
Davidson

(10) Patent No.: US 11,195,962 B2
(45) Date of Patent: Dec. 7, 2021

(54) HIGH RESPONSIVITY HIGH BANDWIDTH PHOTODIODE AND METHOD OF MANUFACTURE

(71) Applicant: Newport Corporation, Irvine, CA (US)

(72) Inventor: Andrew C Davidson, Mountain View, CA (US)

(73) Assignee: Newport Corporation, Irvine, CA (US)

( * ) Notice: Subject to any disclaimer, the term of this patent is extended or adjusted under 35 U.S.C. 154(b) by 1 day.

(21) Appl. No.: 16/478,625

(22) PCT Filed: Feb. 20, 2018

(86) PCT No.: PCT/US2018/018818
§ 371 (c)(1),
(2) Date: Jul. 17, 2019

(87) PCT Pub. No.: WO2018/156516
PCT Pub. Date: Aug. 30, 2018

(65) Prior Publication Data
US 2019/0348549 A1   Nov. 14, 2019

Related U.S. Application Data

(60) Provisional application No. 62/461,323, filed on Feb. 21, 2017, provisional application No. 62/557,364, filed on Sep. 12, 2017.

(51) Int. Cl.
*H01L 31/0232* (2014.01)
*H01L 31/101* (2006.01)
(Continued)

(52) U.S. Cl.
CPC ...... *H01L 31/02327* (2013.01); *H01L 31/101* (2013.01); *H01L 31/18* (2013.01); *H01L 31/0304* (2013.01)

(58) Field of Classification Search
CPC . H01L 31/02327; H01L 31/101; H01L 31/18; H01L 31/0304; H01L 31/03046;
(Continued)

(56) References Cited

U.S. PATENT DOCUMENTS

2002/0084505 A1   7/2002   Furuya
2004/0144912 A1   7/2004   Fukano
(Continued)

OTHER PUBLICATIONS

M. S. Alam, M. S. Rahman, M. R. Islam , A. G. Bhuiyan, and M. Yamada, "Refractive Index, Absorption Coefficient, and Photoelastic Constant: Key Parameters of InGaAs Material Relevant To InGaAs-Based Device Performance", May 2007, IEEE, pp. 343-346.*
(Continued)

*Primary Examiner* — Cuong B Nguyen
(74) *Attorney, Agent, or Firm* — Brian F. Swienton; Edward Scott Trask

(57) ABSTRACT

A high responsivity, high bandwidth photodiode is disclosed which includes at least one substrate, at least one n+ type layer may be formed on the at substrate and configured to receive at least a portion of an incident optical signal from the substrate, at least one supplemental layer formed on the n+ type layer and configured to receive at least a portion of the incident optical signal from the n+ type layer, at least absorbing layer formed on the supplemental layer and configured to receive at least a portion of the incident optical signal from the supplemental layer, at least one angled facet formed on the substrate and configured to direct at least a portion of the incident optical signal to at least one of the n+ type layer, the supplemental layer, and the absorbing layer at angle of incidence from 15° to 89° from a normal angle of incidence.

41 Claims, 9 Drawing Sheets

(51) Int. Cl.
*H01L 31/18* (2006.01)
*H01L 31/0304* (2006.01)

(58) Field of Classification Search
CPC ..... H01L 31/10; H01L 31/105; H01L 25/167; H01L 31/107; H01L 27/14643–14663; H01L 31/06875; H01L 31/0693; H01L 31/073; H01L 31/0735; H01L 31/074; H01L 31/0749; H01L 31/1032–1037; H01L 31/1804; H01L 31/1808; H01L 31/1828–1856; H01L 31/202; H01L 33/0025; H01L 33/0029; H01L 33/0054; H01L 33/0062–0075; H01L 33/0083–0091; H01L 33/28–34
See application file for complete search history.

(56) References Cited

U.S. PATENT DOCUMENTS

| | | | |
|---|---|---|---|
| 2004/0251483 A1 | 12/2004 | Ko | |
| 2005/0116311 A1 | 6/2005 | Kim | |
| 2016/0155888 A1* | 6/2016 | Yamaguchi | H01L 31/1075 438/91 |
| 2017/0012076 A1* | 1/2017 | Chen | H01L 27/14694 |
| 2017/0018664 A1 | 1/2017 | Mathai et al. | |
| 2017/0033253 A1* | 2/2017 | Huntington | H01L 31/1075 |
| 2020/0168749 A1* | 5/2020 | Nishimura | G02B 6/4214 |

OTHER PUBLICATIONS

G. D. Pettit and W. J. Turner, "Refractive index of Inp", Jul. 2004, Journal of Applied Physics 36, No. 6.*

* cited by examiner

HIGH RESPONSIVITY HIGH BANDWIDTH PHOTODIODE AND METHOD OF MANUFACTURE

CROSS-REFERENCE TO RELATED APPLICATIONS

The present application claims priority to U.S. Prov. Pat. Appl. Ser. No. 62/461,323, entitled "Glancing Angle Photodiode and Method of Manufacture", filed on Feb. 21, 2017, and U.S. Prov. Pat. Appl. Ser. No. 62/557,364, entitled "Glancing Angle Photodiode and Method of Manufacture", filed on Sep. 12, 2017, the contents both of which are incorporated by reference in their entirety herein.

BACKGROUND

Photodiodes are the most commonly used photodetectors in use today. Presently, they are used in any variety of applications and are being incorporated into numerous additional applications. Generally, photodiodes convert optical signals into electrical signals (O/E converters). Physically, a photodiode is constructed with planar layers of materials. An optically absorbing layer is sandwiched between two electrically conducting layers. Incident light creates free electrons and holes in the absorbing layer. An electric field then sweeps these carriers in opposite directions to the conducting layers. Typically, the angle of incidence of the incoming light is substantially perpendicular (normal) to the surface of the photodiode.

While presently available photodiodes have proven useful in the past a number of shortcomings have been identified for some applications. For example, the time it takes for the carriers to travel to the conducting layers (transit time) contributes to the bandwidth limitation of the device. As device bandwidth increases above about 20 GHz, the absorbing layer must be made increasingly thinner to reduce transit time. The thinner absorber cannot absorb all of the light, so responsivity is reduced. Thus, above roughly 20 GHz there is a tradeoff between bandwidth and responsivity. Responsivity of a 40 GHz device might be 50% that of a 20 GHz device.

Presently, there are a number of approaches available which serve to decrease transit time within a photodiode. For example, in one approach, double pass architectures have been designed which use high reflection so incident light passes through the absorbing layer twice. And incident optical signal illuminates the device through the device substrate and is reflected by a metallic mirror formed or positioned on the top surface of the device. While offering higher absorption, faster device responsivity is difficult to achieve using a double pass architecture design. In response, photodiodes incorporating a waveguide architecture have been developed. Waveguide photodiodes typically include an absorbing layer buried within or otherwise coupled to an optical waveguide. Light propagating within the waveguide repeatedly traverses the absorbing layer. While this approach offers potentially very high bandwidth, design, fabrication, and fiber coupling can prove challenging. In contrast, resonant cavity enhanced (hereinafter RCE) devices embed the absorbing layer within a resonant cavity to increase the effective optical path length in the absorbing layer. Commonly, a Bragg mirror is positioned beneath the absorbing layer. Current RCE devices have a limited optical bandwidth and the necessity for an integrated mirror increases complexity. Lastly, uni-traveling carrier devices may be constructed such that only electrons contribute to the transit time of the device. Since electrons travel faster than holes, transit time of the device can be reduced and bandwidth increased. However, uni-traveling carrier devices typically have a reduced responsivity.

Thus, there is an ongoing need for a robust photodiode device offering high bandwidth and responsivity.

SUMMARY

The present application discloses various embodiments of a high responsivity, high bandwidth photodiode. In one embodiment, the present application discloses a high responsivity, high bandwidth photodiode which includes at least one substrate. At least one n+ type layer may be formed on the substrate. The n+ type layer may be configured to receive at least a portion of an incident optical signal from the substrate. In addition, at least one supplemental layer may be formed on the n+ type layer and configured to receive at least a portion of the incident optical signal from the n+ type layer. Further, at least one absorbing layer may be formed on the supplemental layer and configured to receive at least a portion of the incident optical signal from the supplemental layer. At least one angled facet is formed on the substrate. During use the angled facet may be configured to direct at least a portion of the incident optical signal to at least one of the n+ type layer, the supplemental layer, and the absorbing layer at angle of incidence from 15° to 89° from a normal angle of incidence.

In another embodiment, the present application is directed to high responsivity, high bandwidth photodiode which may include at least one substrate having an index of refraction from 3.10 to 3.35. At least one n+ type layer may be formed on the substrate. The n+ type layer may be configured to receive at least a portion of an incident optical signal from the substrate. In one embodiment, the n+ type layer has an index of refraction from about 3.10 to about 3.35. At least one supplemental layer may be formed on the n+ type layer, the supplemental layer configured to receive at least a portion of the incident optical signal from the n+ type layer. In one embodiment, the supplemental layer has an index of refraction from about 3.30 to about 3.60. Further, at least one absorbing layer formed on the supplemental layer. The absorbing layer may be configured to receive at least a portion of the incident optical signal from the supplemental layer. The absorbing layer may have an index of refraction from about 3.55 to and 3.75. In addition, at least one angled facet may be formed on the substrate. During use, the angled facet may be configured to direct at least a portion of the incident optical signal to at least one of the n+ type layer, the supplemental layer, and the absorbing layer at angle of incidence from 15° to 89° from a normal angle of incidence.

In another embodiment, the present application discloses a high responsivity, high bandwidth photodiode which includes at least one substrate having an index of refraction from 3.10 to 3.35. At least one n+ type layer may be formed on the substrate and configured to receive at least a portion of an incident optical signal from the substrate, the n+ type layer having an index of refraction from 3.10 to 3.35. Further, at least one supplemental layer may be formed on the n+ type layer and configured to receive at least a portion of the incident optical signal from the n+ type layer, the supplemental layer having an index of refraction from 3.30 to 3.60. At least one absorbing layer may be formed on the supplemental layer and configured to receive at least a portion of the incident optical signal from the supplemental layer, the absorbing layer having an index of refraction from 3.55 to 3.75. In one embodiment, at least one supplemental layer 20 may be applied to the absorbing layer. In addition, at least one p+ type layer may be applied to at least one of the absorbing layer and the supplemental layer, the p+ type layer having an index of refraction ranging from 3.15 to 3.30. At least one angled facet may be formed on the substrate, the angled facet configured to direct at least a portion of the incident optical signal to at least one of the n+ type layer, the supplemental layer, the absorbing layer, the p+ type layer at angle of incidence from 15° to 89° from a normal angle of incidence.

In yet another embodiment, the present application discloses a high responsivity, high bandwidth photodiode which includes at least one substrate having an index of refraction from 3.10 to 3.35 and at least one n+ type layer formed on the substrate and configured to receive at least a portion of an incident optical signal from the substrate, the n+ type layer having an index of refraction from 3.10 to 3.35. At least one supplemental layer may be formed on the n+ type layer and configured to receive at least a portion of the incident optical signal from the n+ type layer, the supplemental layer having an index of refraction from 3.30 to 3.60. At least one absorbing layer may be formed on the supplemental layer and configured to receive at least a portion of the incident optical signal from the supplemental layer, the absorbing layer having an index of refraction from 3.55 to 3.75. Further, at least one metal layer applied to at least one of the absorbing layer and the supplemental layer, wherein the high responsivity, high bandwidth photodiode is configured using a Schottky architecture. Finally, at least one angled facet may be formed on the substrate, the at least one angled facet configured to direct at least a portion of the incident optical signal to at least one of the n+ type layer, the supplemental layer, the absorbing layer, and the metal layer at angle of incidence from 15° to 89° from a normal angle of incidence.

Other features and advantages of the high responsivity, high bandwidth photodiode device and method of manufacture as described herein will become more apparent from a consideration of the following detailed description.

BRIEF DESCRIPTION OF THE DRAWINGS

The novel aspects of the high responsivity, high bandwidth photodiode device and method of manufacture as disclosed herein will be more apparent by review of the following figures, wherein.

DETAILED DESCRIPTION

The present application is directed to various embodiments of the photodiode device and method of manufacture. More specifically, the present application discloses photodiode devices configured to have incoming light incident on the absorbing layers of the photodiode device at a shallow angle (e.g. high incidence angle), thereby permitting increased absorption by two mechanisms: an increased optical path length traversing through the absorption layer; and the increase of the magnitude of reflections between layers making possible a significant resonant cavity effect to enhance absorption in the absorbing layer.

Figure 1:
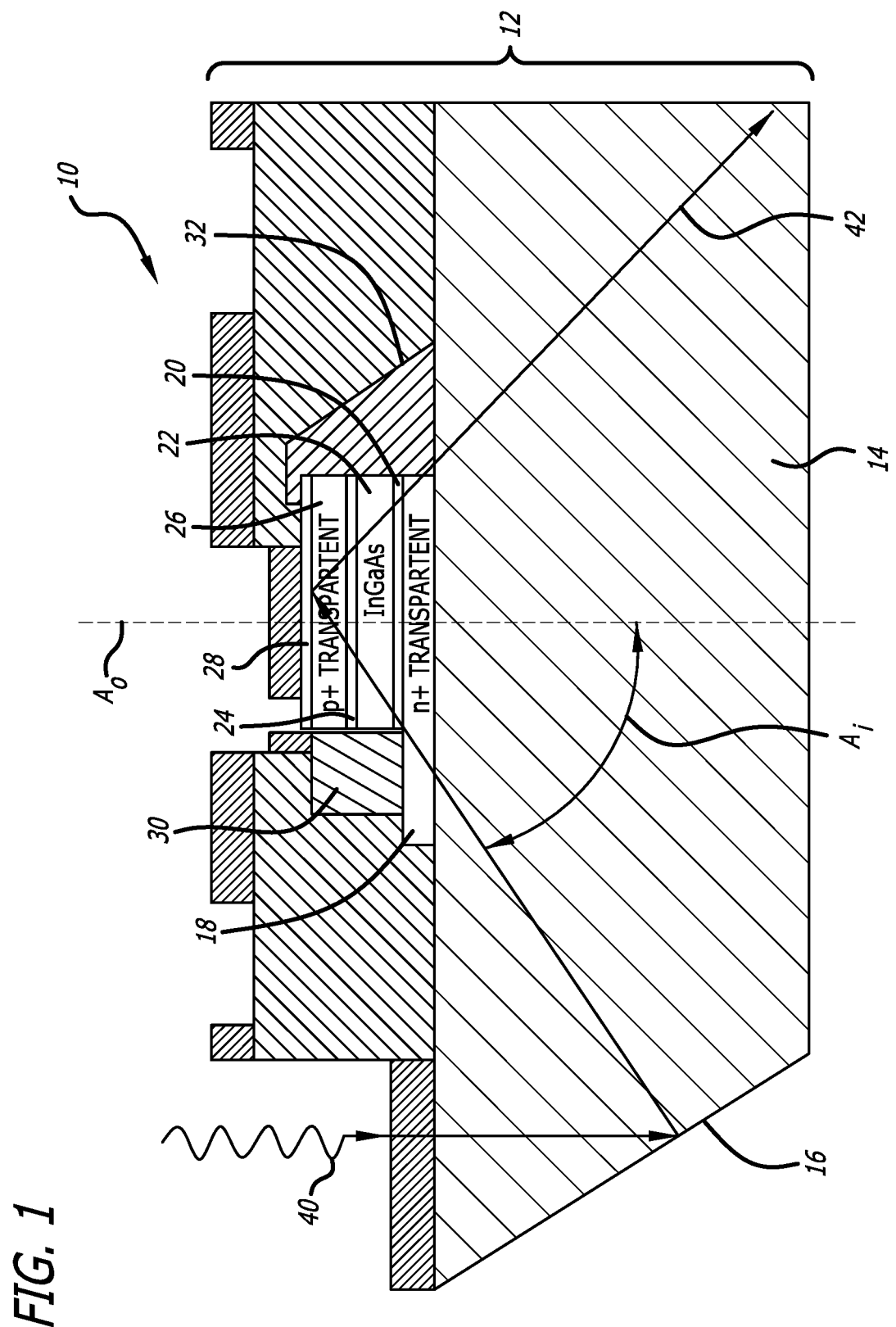
FIG. 1 shows a cross-sectional view of an embodiment of a high responsivity, high bandwidth photodiode having an angled facet formed on a substrate, the angled facet configured to reflect an incident optical signal to active layers formed on the substrate.
Figure 2:
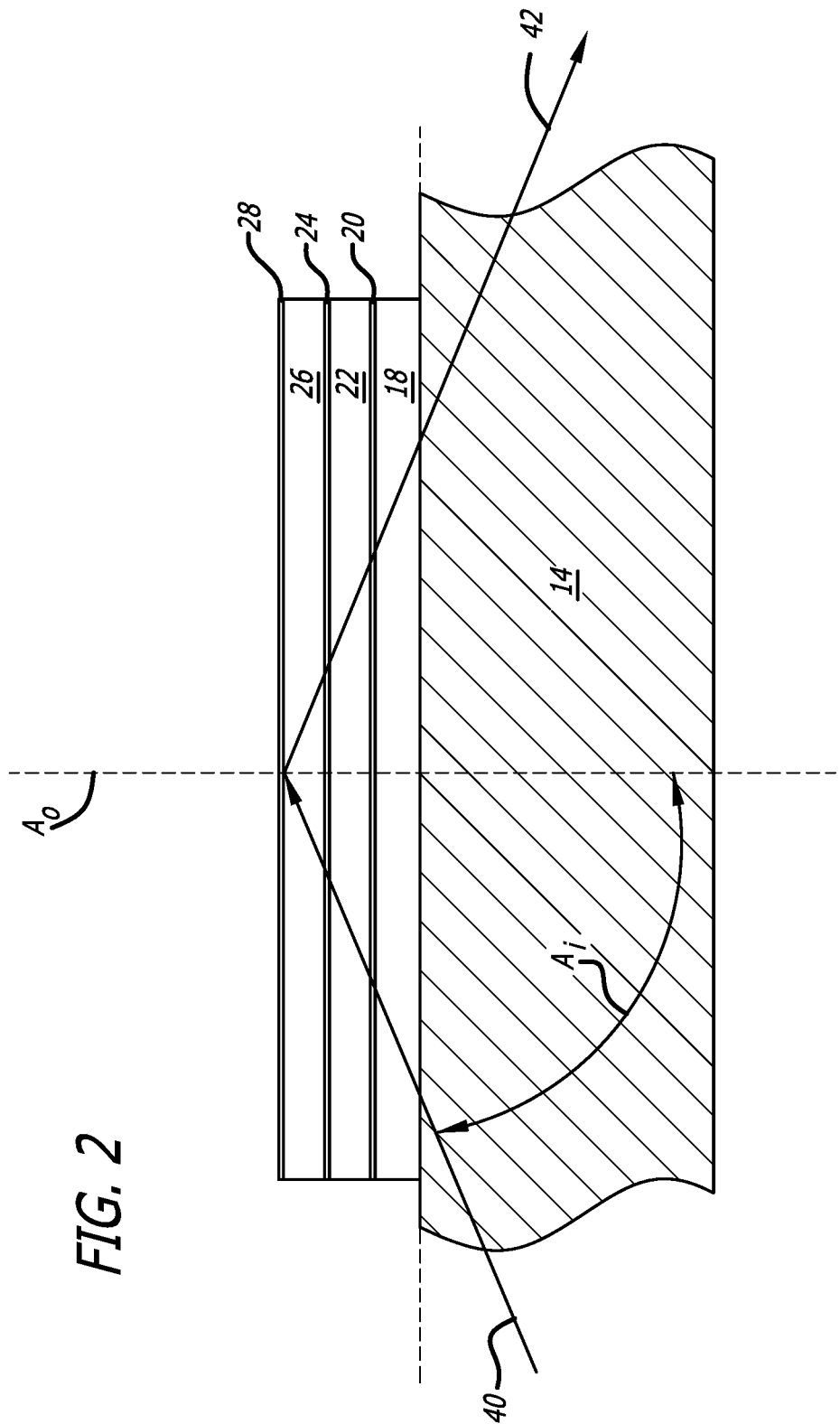
FIG. 2 shows a cross-sectional view of the various active layers of the embodiment of a high responsivity, high bandwidth photodiode shown in Figure 1receiving the incident optical signal at a glancing angle.
Figure 3:
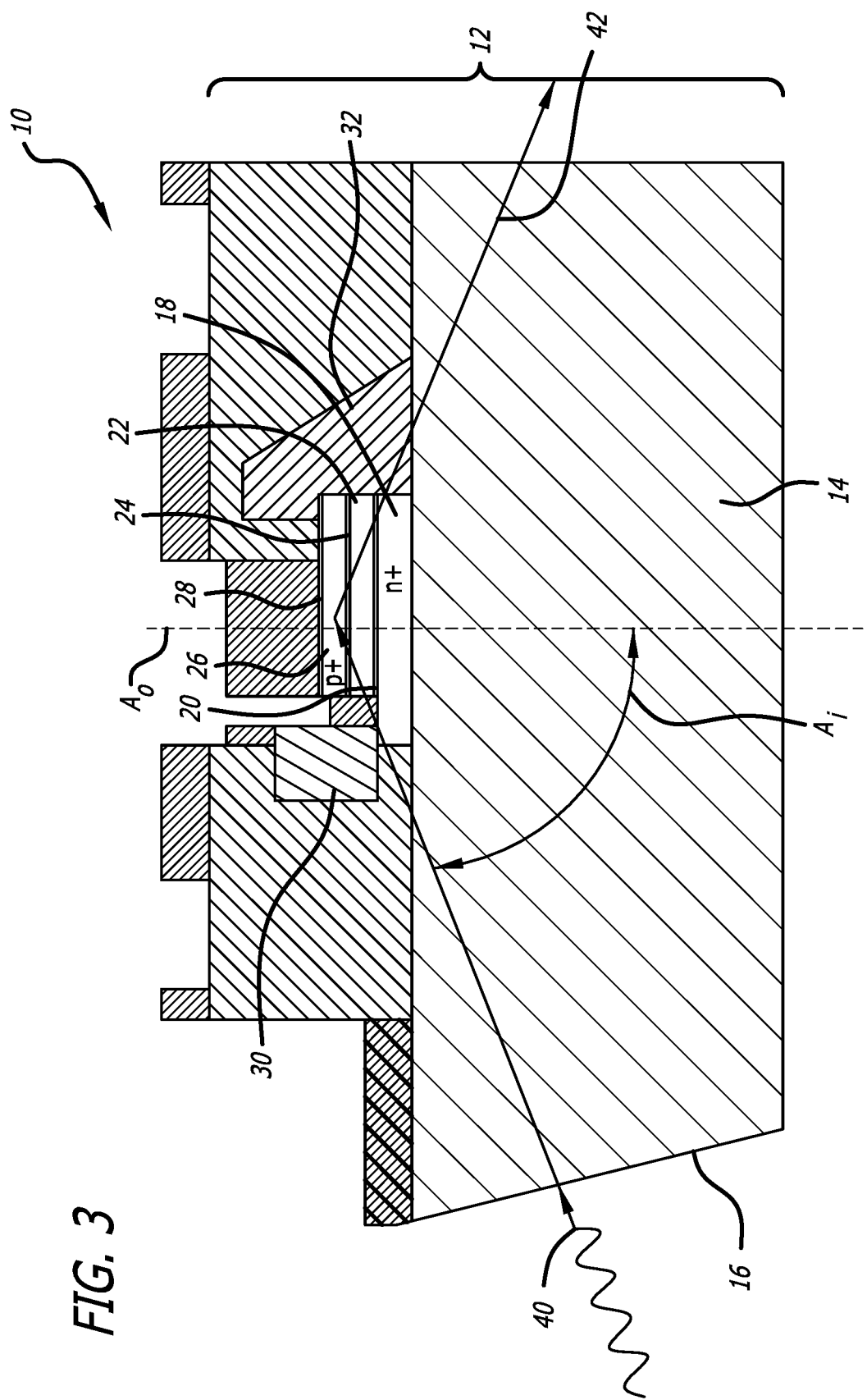
FIG. 3 shows a cross-sectional view of an embodiment of a high responsivity, high bandwidth photodiode having an angled facet formed on a substrate, the angled facet configured to direct an incident optical signal to active layers formed on the substrate using refraction.

FIGS. 1-3 show a cross-sectional view of an embodiment of a photodiode device configured to utilize an architecture wherein the incoming optical signal traverses through the various layers of material forming the photodetector at a glancing angle thereby increasing absorption efficiency. As shown, the photodiode device 10 includes at least one device body 12 having at least one substrate 14. As shown in FIGS. 1 and 3, the substrate 14 includes at least one angled face or facet 16 formed thereon. In one embodiment, the angled facet 16 may be polished, coated, or otherwise conditioned to increase reflection or transmission of an incident optical signal. In the illustrated embodiment, the substrate 14 is manufactured from InP or similar material configured to be transparent to an optical signal beyond its bandgap (e.g. about 0.9 μm to about 2 μm). In the alternative, the substrate 14 may be manufactured from any variety of materials known in the art, including, without limitations, GaAs, Ge, and Si. In one embodiment, the substrate 14 has an index of refraction from about 2.50 to about 4.50. In one specific embodiment, the substrate 14 has an index of refraction from about 3.00 to about 3.50. In another embodiment, the substrate 14 has an index of refraction from about 3.15 to about 3.45. For example, the substrate 14 may have an index of refraction of about 3.20, although those skilled in the art will appreciate that the substrate 14 may be manufactured from a material having any index of refraction. The substrate 14 may be manufactured in a variety of thicknesses. In one embodiment, the substrate 14 has a thickness of about 10 μm to about 3000 μm. In another embodiment, the substrate 14 has a thickness of about 100 μm to about 200 μm.

Referring again to FIGS. 1-3, one or more material layers may be positioned on or formed on the substrate 14. For example, in the illustrated embodiment at least one p+ type layer, at least one n+ type layer, and at least one absorbing or intrinsic layer is positioned on the substrate 14. The photodiode device 10 shown in FIGS. 1-3 includes a n+ type layer 18 position proximate to the substrate 14, the n+ type layer 18 having a thickness of about 10 nm to about 5000 nm. In another embodiment, the n+ type layer 18 has a thickness of about 300 nm to about 2000 nm. Optionally, the n+ type layer 18 has a thickness of about 500 nm to about 1000 nm. The n+ type layer 18 may be manufactured from any variety of materials. In one embodiment, the n+ type layer 18 is manufactured from InP. In another embodiment, the n+ type layer 18 is manufactured from InAlAs, although those skilled in the art will appreciate that the n+ type layer 18 may be manufactured from any variety of n+ type materials. In one embodiment, the n+ type layer 18 has an index of refraction ranging from about 2.75 to about 4.00. In another embodiment, the n+ type layer 18 has an index of refraction from about 3.10 to about 3.35. In a more specific embodiment, the n+ type layer has an index of refraction from about 3.15 to about 3.30, although those skilled in the art will appreciate that the n+ type layer 18 may have any desired index of refraction.

As shown in FIGS. 1-3, at least one supplemental layer 20 may be positioned on the photodiode device 10. In one embodiment, a single supplemental layer 20 is formed on the n+ type layer 18. In another embodiment, multiple supplemental layers 18 may be formed on the n+ type layer 18. For example, two (2), three (3), four (4), five (5) supplemental layers 20 or more may be formed on the n+ type layer 18. In the illustrated embodiment, the photodiode device 10 includes a supplemental layer 20 having a thickness of about 5 nm to about 200 nm. In another embodiment, the supplemental layer 20 has a thickness of about 10 nm to about 50 nm. Optionally, the supplemental layer 20 has a thickness of about 200 nm to about 1000 nm. Further, multiple supplemental layers 20 of varying thicknesses may be applied to the n+ type layer 18. The supplemental layer 20 may be manufactured from any variety of materials. In one embodiment, the supplemental layer 20 is manufactured from InGaAsP. In another embodiment, the supplemental layer 20 is manufactured from InGaAlAs, although those skilled in the art will appreciate that the supplemental layer 20 may be manufactured from any variety of supplemental materials, including, for example, alternate epitaxial layer materials. In one embodiment, the supplemental layer 20 may be configured to condition or otherwise modify an optical signal traversing through the photodiode device 10. For example, supplemental layer 20 may create partial reflections at its boundaries due to index mismatch. In one embodiment, the supplemental layer 20 has an index of refraction from about 3.00 to about 4.00. In another embodiment, the supplemental layer 20 has an index of refraction from about 3.25 to about 3.75. Optionally, the supplemental layer 20 may have an index of refraction from about 3.25 to about 3.55. Further, multiple supplemental layers 20 may be used in the present device wherein the various supplemental layers 20 have the same index of refraction and/or thickness. In another embodiment, the various supplemental layers 20 may have different indexes of refraction and/or thicknesses. Further, the supplemental layer 20 may introduce an optical propagation delay so as to modify the phase of an optical signal passing through the supplemental layer 20. In another embodiment, the supplemental layer 20 may be configured to condition or otherwise modify transport of electrical carriers generated within the photodiode device 10. For example, it may contribute to conduction and/or valence energy band profiles which reduce barriers and help electrical carriers to travel quickly to the conducting layers. Optionally, the supplemental layer 20 may be configured to condition or modify an optical signal, electrical carrier transport, and/or both within the photodiode device 10. In another embodiment, the photodiode device 10 may be manufactured without a supplemental layer 20.

Referring again to FIGS. 1-3, the photodiode device 10 includes one absorbing or intrinsic layer 22 positioned on or formed proximate to the supplemental layer 20. In the illustrated embodiment, the absorbing layer 22 is manufactured from InGaAs. Optionally, the absorbing layer 22 may be manufactured from a single layer or multiple layers any variety of intrinsic or absorbing materials including, without limitation, GaAs, Ge, Si, PbSe, InAs, PbS, HgCdTe, HgCdZnTe, InAs, InSb, and AgOCs. In one embodiment, the absorbing layer 22 has a thickness of about 50 nm to about 2000 nm. In another embodiment, the absorbing layer 22 has a thickness of about 200 nm to about 600 nm. In still another embodiment, the absorbing layer 22 has a thickness of about 400 nm to about 500 nm, although those skilled in the art will appreciate that the absorbing layer 22 may be manufactured having any desired thickness. The absorbing layer 22 may have an index of refraction from about 3.00 to about 4.00. In another embodiment, the absorbing layer 22 has an index of refraction from about 3.50 to about 3.75. Optionally, the absorbing layer 22 may have an index of refraction from about 3.60 to about 3.70, although those skilled in the art will appreciate that absorbing layer 22 may be manufactured with any desired index of refraction.

As shown in FIGS. 1-3, the photodiode device 10 may include a second supplemental layer 24 positioned on or proximate to the absorbing layer 22. Like the supplemental layer 20 formed on the n+ type layer 18, the second supplemental layer 24 may be formed from multiple layers of materials. In one embodiment, the second supplemental layer 24 may be manufactured from InP. In another embodiment, the second supplemental layer 24 may be manufactured from InAlAs. Optionally, the second supplemental layer 24 may be manufactured from InGaAsP, InGaAlAs, or similar materials. Like the first supplemental layer 20, the second supplemental layer 24 may be configured to condition or otherwise modify the optical characteristics, electrical characteristics, or both of an optical signal or electrical carriers traversing within the photodiode device 10. For example, the second supplemental layer 24 may create reflections at the boundaries of the supplemental layer 20 and delay across its extent, and/or it may contribute to beneficial energy band profiles. As such, the second supplemental layer 24 may have an index of refraction from about 3.00 to about 4.00. In another embodiment, the second supplemental layer 24 has an index of refraction from about 3.25 to about 3.75. Optionally, the second supplemental layer 24 may have an index of refraction from about 3.25 to about 3.55. In one embodiment, the second supplemental layer 24 as a thickness of about 5 nm to about 500 nm. In another embodiment, the second supplemental layer 24 may have a thickness of about 30 nm to about 100 nm. For example, the second supplemental layer 24 may have a thickness of about 47 nm. Optionally, the photodiode device 10 need not include a second supplemental layer 24.

Referring again to FIGS. 1-3, at least one p+ type layer 26 may be positioned on or proximate to the second supplemental layer 24. In the illustrated embodiment, the p+ type layer 26 is manufactured from InP, InAlAs, or similar materials known in the art. In one embodiment, the p+ type layer 26 has a thickness of about 50 nm to about 3000 nm. In another embodiment, the p+ type layer 26 has a thickness of about 300 nm to about 1500 nm. Optionally, the p+ type layer 26 may have a thickness of about 500 nm to about 1000 nm. The p+ type layer 26 may have an index of refraction from about 2.75 to about 4.00. In another embodiment, the p+ type layer 26 has an index of refraction from about 3.00 to about 3.50. Alternatively, the p+ type layer 26 has an index of refraction from about 3.15 to about 3.30.

Optionally, the photodiode device 10 may be manufactured without a p+ type layer 26. For example, at least one metal layer may replace the p+ type layer 26 to form a Schottky contact. Exemplary materials which may be used to form the metal layer include, without limitations, gold, (Au), silver (Ag), copper, and various other conductive materials and/or alloys, transparent conductive materials, reflective materials, dielectric materials and the like.

As shown in FIGS. 1-3, the photodiode device 10 may include at least one additional layer or device 28 apply to or positioned on the p+ type layer 26 or metal layer (in a Schottky-type device). For example, in one embodiment the additional layer 28 comprises at least one antireflective coating. Exemplary antireflective coatings include, without limitations, $Si_3N_4$, $TiO_2$, $Al_2O_3$, $MgF_2$, $CeO_2$, ZnS, and the like. Optionally, the additional layer 28 may comprises one or more metallic materials, dielectric materials, and the like. In one embodiment, the additional layer 28 has a thickness of about 10 nm to about 3000 nm. Optionally, the additional layer 28 may have a thickness of about 100 nm to about 2000 nm. For example, additional layer 28 may have a thickness of about 75 nm to about 1400 nm.

Referring again to FIGS. 1-3, those skilled in your art will appreciate that the various layers of materials forming the photodiode device 10 may be applied or formed using any variety of methods or techniques. For example in one embodiment, at least one of the n+ type layer 18, supplemental layer 20, absorbing layer 22, second supplemental layer 24, p+ type layer 26, and additional layer 28 may be applied using a chemical vapor deposition process. Optionally, at least one of the n+ type layer 18, supplemental layer 20, absorbing layer 22, second supplemental layer 24, p+ type layer 26, and additional layer 28 may be applied using a metal-organic chemical vapor deposition process. In another embodiment, at least one of the n+ type layer 18, supplemental layer 20, absorbing layer 22, second supplemental layer 24, p+ type layer 26, and additional layer 28 may be applied using molecular beam epitaxy, the Czochralski method, ion implantation process, sol-gel process, spin-coating process, thermal evaporation process, reactive evaporation process, ion sputtering, magnetron sputtering, and the like.

As shown in FIGS. 1-3, at least one anode 32 and cathode 30 is in communication with at least one of the n+ type layer 18, supplemental layer 20, absorbing layer 22, second supplemental layer 24, p+ type layer 26, and additional layer 28. For example, in one embodiment the n+ type layer 18 is in communication with the cathode 30. In another embodiment, the p+ type layer 26 is in communication with the anode 32. Optionally, the absorbing layer 22 may be in communication with at least one of the anode 32 and/or cathode 30.

FIGS. 1-3 show an optical signal 40 the photodiode device 10. In one embodiment, the optical signal 40 comprises a focused beam. In another embodiment, the optical signal 40 need not comprise a focused beam. As shown, the optical signal 40 traverses through a portion of the substrate 14 is incident on the angled facet 16 formed on the substrate 14. The angled facet 16 directs the optical signal 42 to the various layers (e.g. n+ type layer 18, supplemental layer 20, absorbing layer 22, second supplemental layer 24, p+ type layer 26, and additional layer 28) formed in the photodiode device 10. Optionally, the optical signal 40 may be configured to traverse through the angled facet 16. Those skilled in the art will appreciate that presently available photodiode devices typically have the light incident on the p-i-n layers formed therein substantially co-linear with the optical axis $A_o$ (normal angle of incidence) of the photodiode. However, in contrast, as shown on FIGS. 1-3, the optical signal 40 reflected from the angled facet 16, is incident upon the p+ type layer 26, absorbing layer 22, and n+ type layer 18 at a shallow angle (glancing angle), thus having a large angular displacement (angle of incidence $A_i$) from optical axis (normal angle of incidence $A_o$) of the photodiode. FIG. 3 shows an embodiment wherein the optical signal 40 traverse through the angled facet 16, is incident upon the p+ type layer 26, absorbing layer 22, and n+ type layer 18 at a glancing angle, having a large angular displacement (angle of incidence $A_i$) from optical axis (normal angle of incidence $A_o$) of the photodiode. In the illustrated embodiments the angle of incidence $A_i$ of the optical signal 40 on the n+ type layer 18 is about 15° to about 89°. In another embodiment, the angle of incidence $A_i$ of the optical signal 40 on the n+ type layer 18 is about 18° to about 65°. Optionally, the angle of incidence $A_i$ of the optical signal 40 on the n+ type layer 18 is about 40° to about 75°. For example, the angle of incidence $A_i$ of the optical signal 40 on the n+ type layer 18 is greater than about 65°.

As shown in FIGS. 1-3, the optical path length of both the optical signal 40 and reflected light 42 is greater than the optical path length of light incident on the p-i-n layers substantially co-linear with the optical axis $A_o$ (normal angle of incidence of prior art photodiode devices) of the photodiode. The increase in the optical path length through the absorbing layer 22 permits a decreased thickness of the absorbing layer 22 while offering high bandwidths and improved responsivity. When the absorbing layer 22 has a higher index of refraction than the substrate 14, refraction of the beam will lead to a reduced path length through the absorbing layer 22 compared to a refraction-free path. Even with this effect, significant benefit (increase in optical path length compared to normal incidence) can still be realized. In one embodiment, the photodiode device 10 may have a bandwidth of about 10 GHz to about 100 GHz. Another embodiment, the photodiode device 10 may have a bandwidth of about 60 GHz to about 80 GHz, while offering responsivity greater than about 0.5 A/W at a wavelength of about 1100 nm to about 1400 nm. Optionally, the photodiode device 10 may offer responsivity of greater than about 0.8 A/W at about 1310 nm.

In addition, as shown in FIGS. 1-3, the optical signal 40 traverses through the absorbing layer 22 and is reflected by at least one of the p+ type layer 26, the additional layer 28, or both. In one embodiment, the angle of incidence $A_i$ of the optical signal 40 on the at least one of the p+ type layer 26, the additional layer 28, or both may be greater than the critical angle (wherein $\Theta_c = \arc(n_1/n_2)$) thereby resulting in total internal reflection (hereinafter TIR) of the optical signal 40. As a result, the reflected light 42 traverses again to the absorbing layer 22 thereby doubling the path length through the absorbing layer 22. Optionally, rather than relying on TIR, the contact metal of a Schottky diode could act as a mirror to create the reflection. Exemplary contact metals include, without limitations, Au, -, Cu, and the like. In another embodiment, one or more reflection enhancing materials may be applied to the p+ type layer 26, absorbing layer 22, and/or additional layers 28.

Because a high angle of incidence leads to greater reflections at layer boundaries, a resonant cavity can be formed between the TIR reflection and reflection from interfaces on the substrate side of the absorbing layer 22. Such a cavity would contain the absorbing layer 22, and as such absorption would be enhanced over certain wavelength regions. Thus both resonant cavity enhancement and path length enhancement due to the total internal reflectance and the glancing angle can simultaneously contribute to increased responsivity.

Another consideration resulting from the angle of incidence is polarization dependence—the angle of incidence introduces polarization dependence of the reflections between layers. Many applications require low polarization dependence. Thus layer thicknesses and materials must be chosen with consideration of thin film interference effects to simultaneously accomplish:

1. low polarization dependence
2. resonant enhancement at desired wavelength(s)
3. rapid collection of electrical carriers The present application further discloses number alternate architectures. For example, FIGS. 4-9 show alternate embodiments of the photodiode configured to receive incident light at a glancing angle, or more specifically, and at angle approaching the critical angle for total internal reflectance or an incidence angle highly displaced from the normal angle of incidence. As such, similarly named layers and elements perform similar functions to the elements described above and shown in FIGS. 1-3. As such, the various layers described below share similar performance characteristics (thicknesses, indices or refractions, etc.) to similarly named layers and material described above.

Figure 4:
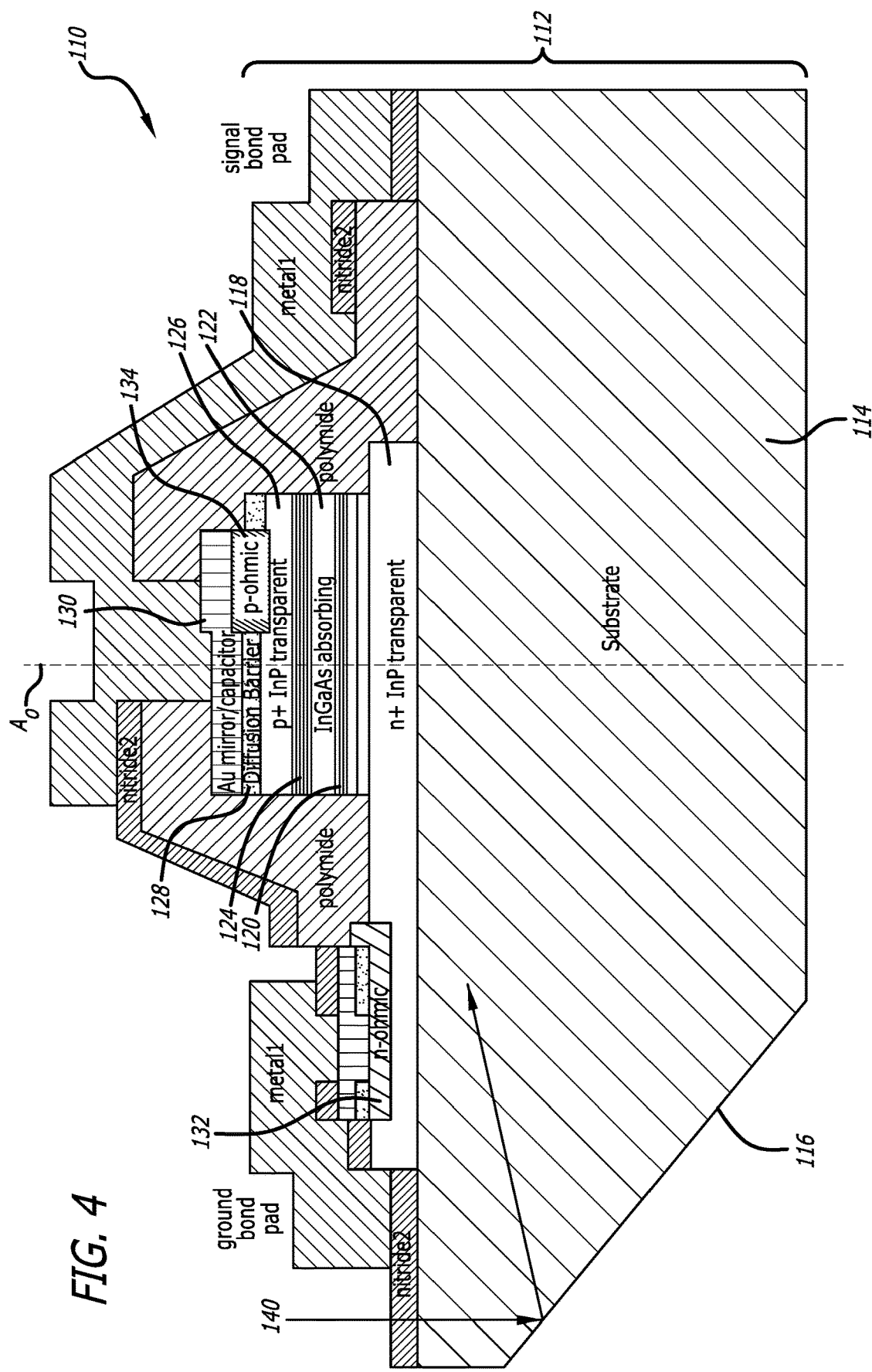
FIG. 4 shows a cross-sectional view of another embodiment of a high responsivity, high bandwidth photodiode having an angled facet formed on a substrate, the angled facet configured to reflect an incident optical signal to active layers formed on the substrate.
Figure 5:
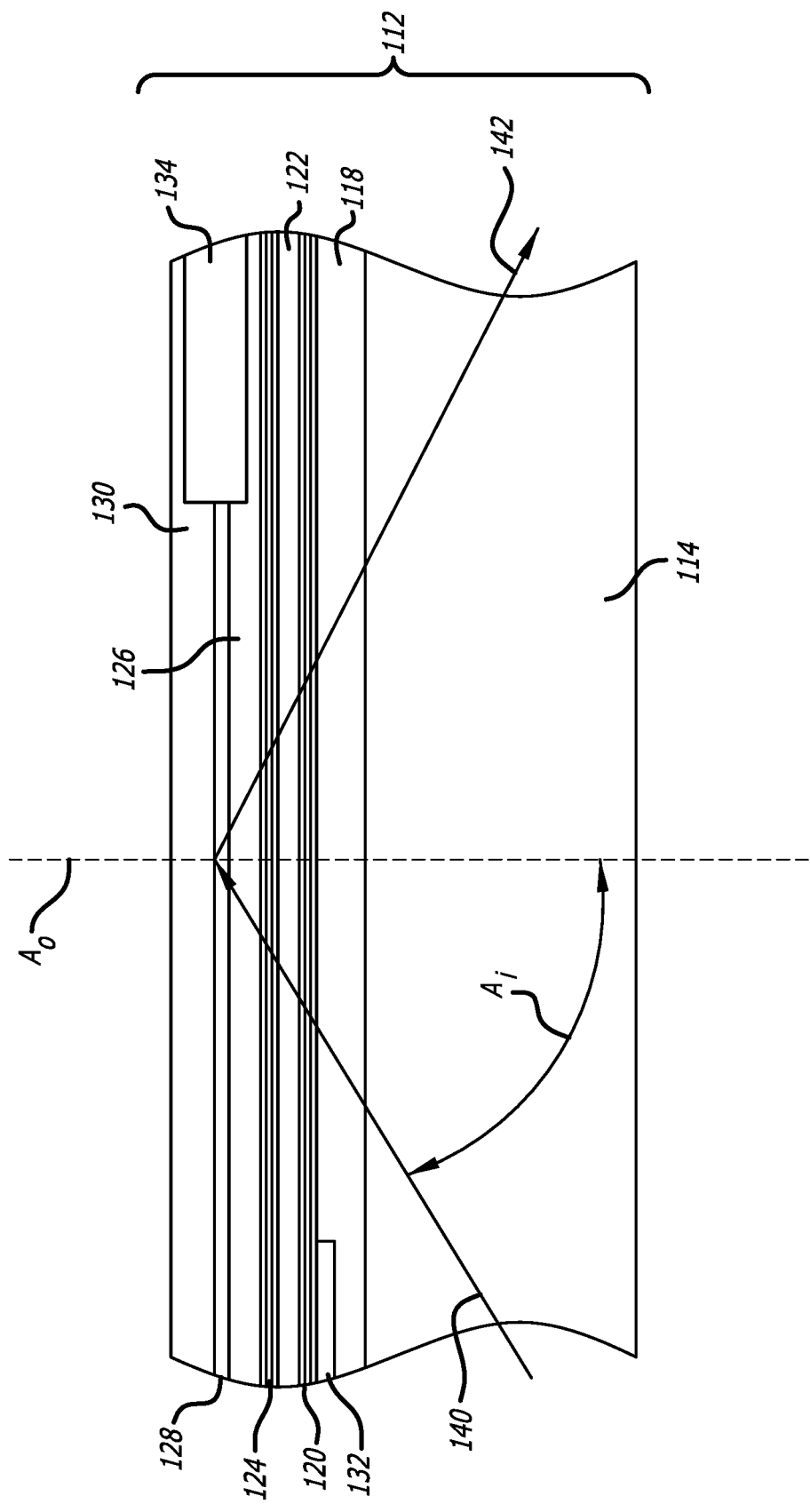
FIG. 5 shows a cross-sectional view of the various active layers of the embodiment of a high responsivity, high bandwidth photodiode shown in FIG. 4 receiving the incident optical signal at a glancing angle.

As shown in FIGS. 4 and 5, the photodiode device 110 includes a device body 112. Like the previous embodiments, the device body 112 includes at least one substrate 114 having at least one angled facet 116 configured to reflect or otherwise direct the incident light to the active region of the photodiode device 110. As such, at least one optical signal 140 may be reflected by or refracted by the angled facet 116. In the illustrated embodiments, at least one n+ type layer is positioned on or proximate to the substrate 114. At least one supplemental layer may be formed on the photodiode device 110. In the illustrated embodiment, the photodiode device 110 includes a first supplemental layer 120 and a second supplemental layer 124, although those skilled in the art will appreciate the any number of supplemental layers may be formed substrate 114. As shown, the first supplemental layer 120 may be positioned on and/or proximate to the n+ type layer 118. In one embodiment, at least one of supplemental layer 120, 124 may be manufactured from InP. In another embodiment, at least one supplemental layer 120, 124 may be manufactured from InAlAs, InGaAsP, InGaAlAs, or other materials. In one embodiment, at least one supplemental layer 120, 124 may comprise multiple layers of supplemental materials. At least one n-ohmic device or structure 132 may be formed within or proximate to at least one of the n+ type layer 118, the first supplemental layer 120, or both.

Referring again to FIGS. 4 and 5 at least one absorbing or intrinsic layer 122 may be positioned on or proximate to the supplemental layer 120. Any variety of absorbing or intrinsic materials may be used to form the absorbing or intrinsic layer 120. Exemplary materials include, without limitation, of intrinsic or absorbing materials including, without limitation, InGaAs, GaAs, Ge, Si, PbSe, InAs, PbS, HgCdTe, HgCdZnTe, InAs, InSb, and AgOCs, although those skilled in the art will appreciate any variety of additional absorbing or intrinsic materials may be used.

As shown in FIGS. 4 and 5, the second supplemental layer 124 may be positioned or formed on the absorbing or intrinsic layer 122. Like the first supplemental layer 120, the second supplemental layer 124 may be manufactured from any variety of materials such as the materials used to form the first supplemental layer 120. In the alternative, the second supplemental layer 124 may be manufactured from different materials than the first supplemental layer 120. At least one p+ type layer 126 may be formed on or positioned on the second supplemental layer 124. Those skilled in the art will appreciate that the p+ type layer 126 may be manufactured from any variety of materials and may be formed in any variety of thicknesses. Optionally, at least one p-ohmic device or structure 134 may be positioned within or proximate to the p+ type layer 126. Further, the p+ type layer 126 may include one or more additional materials, therein. Exemplary materials include, without limitations, InP and similar materials.

Referring again to FIGS. 4 and 5, at least one diffusion barrier layer 128 and at least one reflective layer 130 may be formed on or positioned proximate to p+ type layer 426. In one embodiment, the diffusion barrier layer 128 comprises a nitride material, although those skilled in your will appreciate any number of materials configured to prevent the reflective layer 130 from diffusing into the p+ type layer 126. Further, any variety of materials may be used to form the reflective layer 130. In one embodiment, the reflective layer 130 comprises gold. In another embodiment, the reflective layer 130 comprises silver, aluminum, titanium, thin film materials, dielectric materials, semiconductor materials, and the like configured to be highly reflective to light at a desired wavelength. Optionally, the reflective layer 228, if a metal, may also capacitively couple to the p+ layer and, at higher frequencies, reduce resistance arising from the p+ layer. As such, this resistance, which interacts with the diode junction capacitance, reduces device bandwidth. As a result, reducing this resistance may also increase bandwidth.

During use, an incident optical signal 140 is reflected by the angled facet 116 of the substrate 114 forming the device body 112. The optical signal 140 traverses through the angled facet 116 and may be incident upon the p+ type layer 126, absorbing layer 22, and n+ type layer 118 at a glancing angle, having a large angular displacement (angle of incidence $A_i$) from optical axis (normal angle of incidence $A_o$) of the photodiode. In the illustrated embodiments the angle of incidence $A_i$ of the optical signal 140 on the n+ type layer 118 is about 15° to about 89°. In another embodiment, the angle of incidence $A_i$ of the optical signal 140 on the n+ type layer 118 is about 18° to about 65°. Optionally, the angle of incidence $A_i$ of the optical signal 140 on the n+ type layer 118 is about 40° to about 75°. For example, the angle of incidence $A_i$ of the optical signal 40 on the n+ type layer 18 is greater than about 65°.

Like the embodiments shown in FIGS. 1-3 and described above, the angle of incidence $A_i$ may be greater than or equal to the critical angle of total internal reflectance as determined by any of the interfaces above the absorbing layer 122, including the interface between the ambient atmosphere and the topmost layer. As such, the optical signal 140 traverses through the multiple layers forming the active region of the photodiode device 110 and may be reflected by at least one reflective layer 130. As a result, the reflected optical signal 142 traverses again through the active region of the photodiode device 110. Like the previous embodiments, the shallow angle of incidence of the optical signal 140 results in a longer optical path length to the active material forming the photodiode device 110 as compared with an optical signal having a steep angle of incidence, thereby resulting in a higher responsivity and sensitivity to incident light. Also, larger reflection coefficients at larger $A_i$ allow thin-film interference to be used to create effects such as resonant cavity enhancement, further increasing responsivity.

Figure 6:
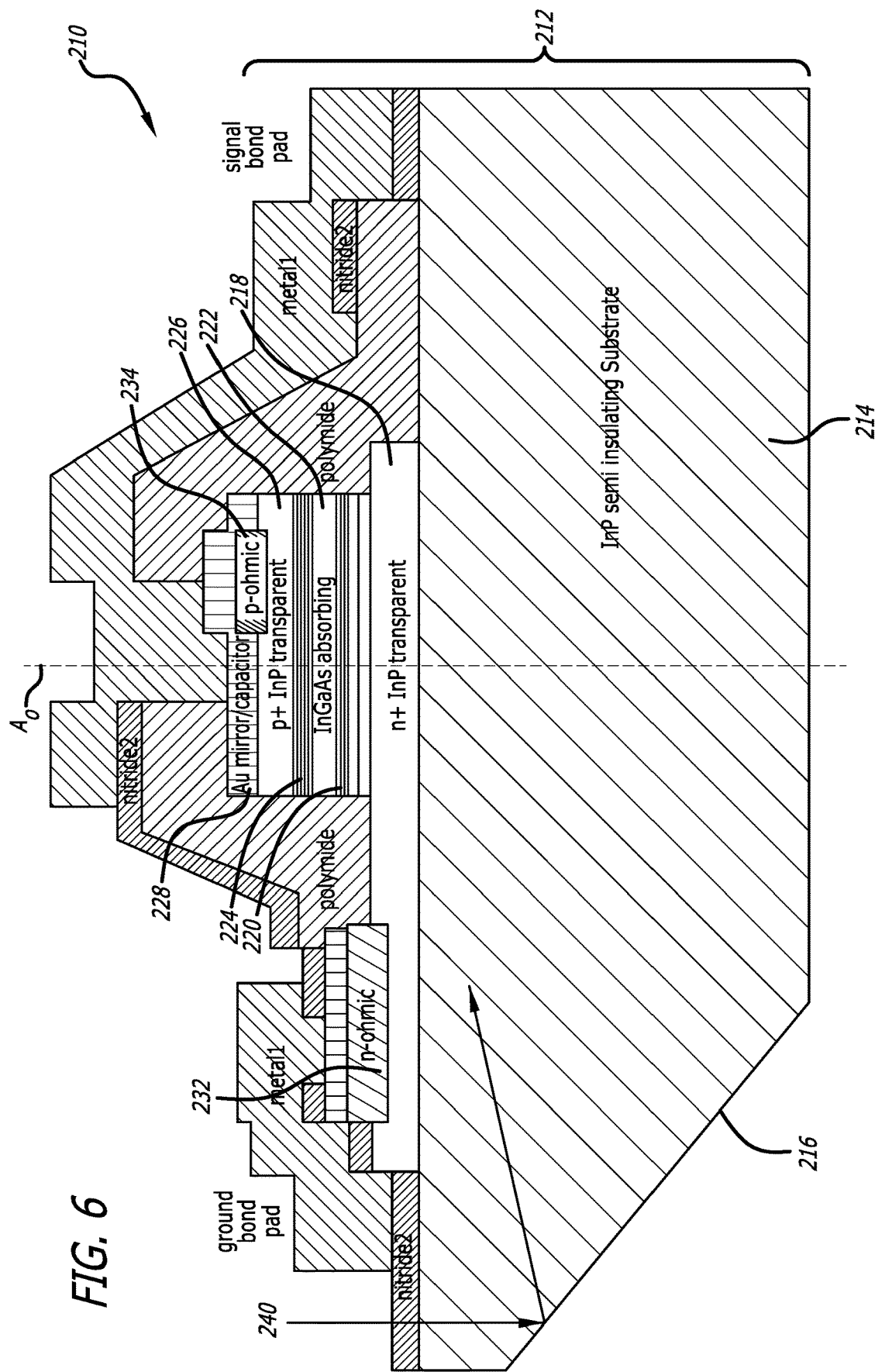
FIG. 6 shows a cross-sectional view of another embodiment of a high responsivity, high bandwidth photodiode having an angled facet formed on a substrate, the angled facet configured to reflect an incident optical signal to active layers formed on the substrate.
Figure 7:
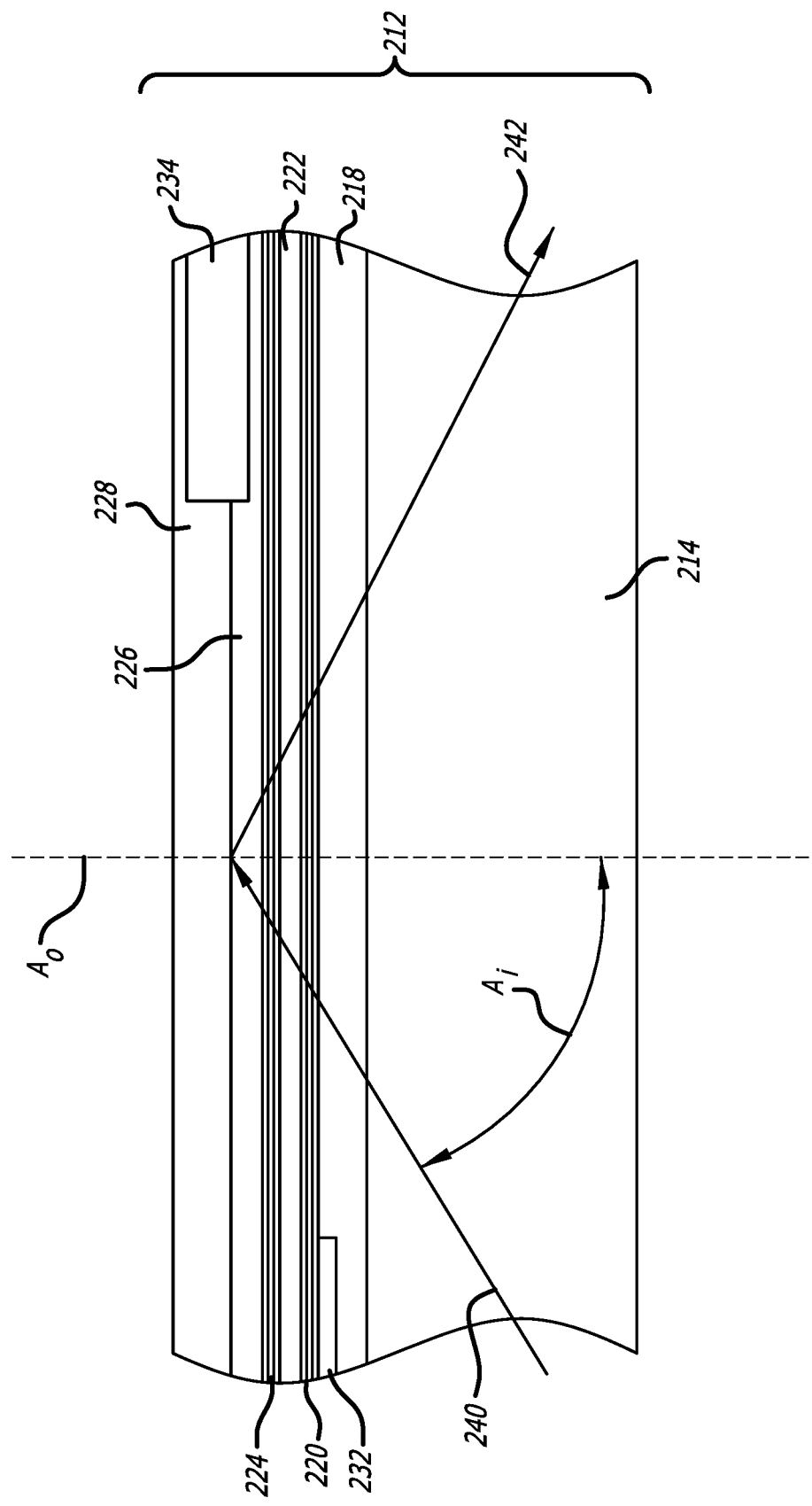
FIG. 7 shows a cross-sectional view of the various active layers of the embodiment of a high responsivity, high bandwidth photodiode shown in FIG. 6 receiving the incident optical signal at a glancing angle.

FIGS. 6 and 7 show another alternate embodiment of the photodiode configured to receive incident light at a glancing angle having a large angular displacement (angle of incidence $A_i$) from optical axis (normal angle of incidence $A_o$) of the photodiode. As shown, the photodiode device 210 includes a device body 212. Like the previous embodiments, the device body 212 includes at least one substrate 214 having at least one angled facet 216 configured to reflect or otherwise direct incident light to the active region of the photodiode device 210. In the illustrated embodiments, at least one n+ type layer 218 is positioned on or proximate to the substrate 214. At least one supplemental layer may be formed on the photodiode device 210. In the illustrated embodiment, the photodiode device 210 includes a first supplemental layer 220 and a second supplemental layer 224. As shown, at least one n-ohmic 232 device or structure may be formed within or proximate to at least one of the n+ type layer 218, the first supplemental layer 220, or both.

Referring again to FIGS. 6 and 7 at least one absorbing or intrinsic layer 222 may be positioned on or proximate to the supplemental layer 220. Any variety of absorbing or intrinsic materials may be used to form the absorbing or intrinsic layer 220. Further, the second supplemental layer 224 may be positioned or formed on the absorbing or intrinsic layer 222. Like the first supplemental layer 220, the second supplemental layer 224 may be manufactured from any variety of materials such as the materials used to form the first supplemental layer 220. In the alternative, the second supplemental layer 224 may be manufactured from different materials than the first supplemental layer 220. At least one p+ type layer 226 may be formed on or positioned on the second supplemental layer 224. Those skilled in the art will appreciate that the p+ type layer 226 may be manufactured from any variety of materials and may be formed in any variety of thicknesses. Further, the p+ type layer 226 may include one or more additional materials, therein. Exemplary materials include, without limitations, InP and similar materials. Optionally, at least one p-ohmic device or structure 234 may be positioned within or proximate to the p+ type layer 226.

Referring again to FIGS. 6 and 7, at least one reflective layer 228 may be formed on or positioned proximate to p+ type layer 226. Further, any variety of materials may be used to form the reflective layer 228. In one embodiment, the reflective layer 228 comprises gold. In another embodiment, the reflective layer 228 comprises silver, aluminum, titanium, thin film materials, dielectric materials, semiconductor materials, and the like configured to be highly reflective to light at a desired wavelength. This reflective layer 228, if a metal, also capacitively couples to the p+ layer and at higher frequencies reduces resistance arising from the p+ layer. This resistance, which interacts with the diode junction capacitance, reduces device bandwidth, so that reducing it can increase bandwidth.

During use, an incident optical signal 240 is reflected by the angled facet 216 of the substrate 214 forming the device body 212. In one embodiment, the angled facet 216 is configured to reflect or refract the optical signal 240 to at least one of the n+ type layer 218, supplemental layers 222, 224, p+ type layer 226, and/or reflective layer 228 at a glancing angle, thus having a large angular displacement (angle of incidence $A_i$) from optical axis (normal angle of incidence $A_o$) of the photodiode. In one embodiment, the angle of incidence $A_i$ is greater than or equal to the critical angle of total internal reflectance as determined by any of the interfaces above the absorbing layer, including the interface between the ambient atmosphere and the topmost layer. As such, the optical signal 240 traverses through the multiple layers forming the active region of the photodiode device 210 and may be reflected by at least one reflective layer 228. As a result, the reflected optical signal 242 traverses again through the active region of the photodiode device 210. Like the previous embodiments, the large angular displacement (angle of incidence $A_i$) of the optical signal 240 from optical axis (normal angle of incidence $A_o$) results in a longer optical path length through the active material forming the photodiode device 210 as compared with an optical signal having a normal angle of incidence, thereby resulting in a higher responsivity and sensitivity to incident light. Also, larger reflection coefficients at larger $A_i$ allow thin-film interference to be used to create effects such as resonant cavity enhancement, further increasing responsivity.

Figure 8:
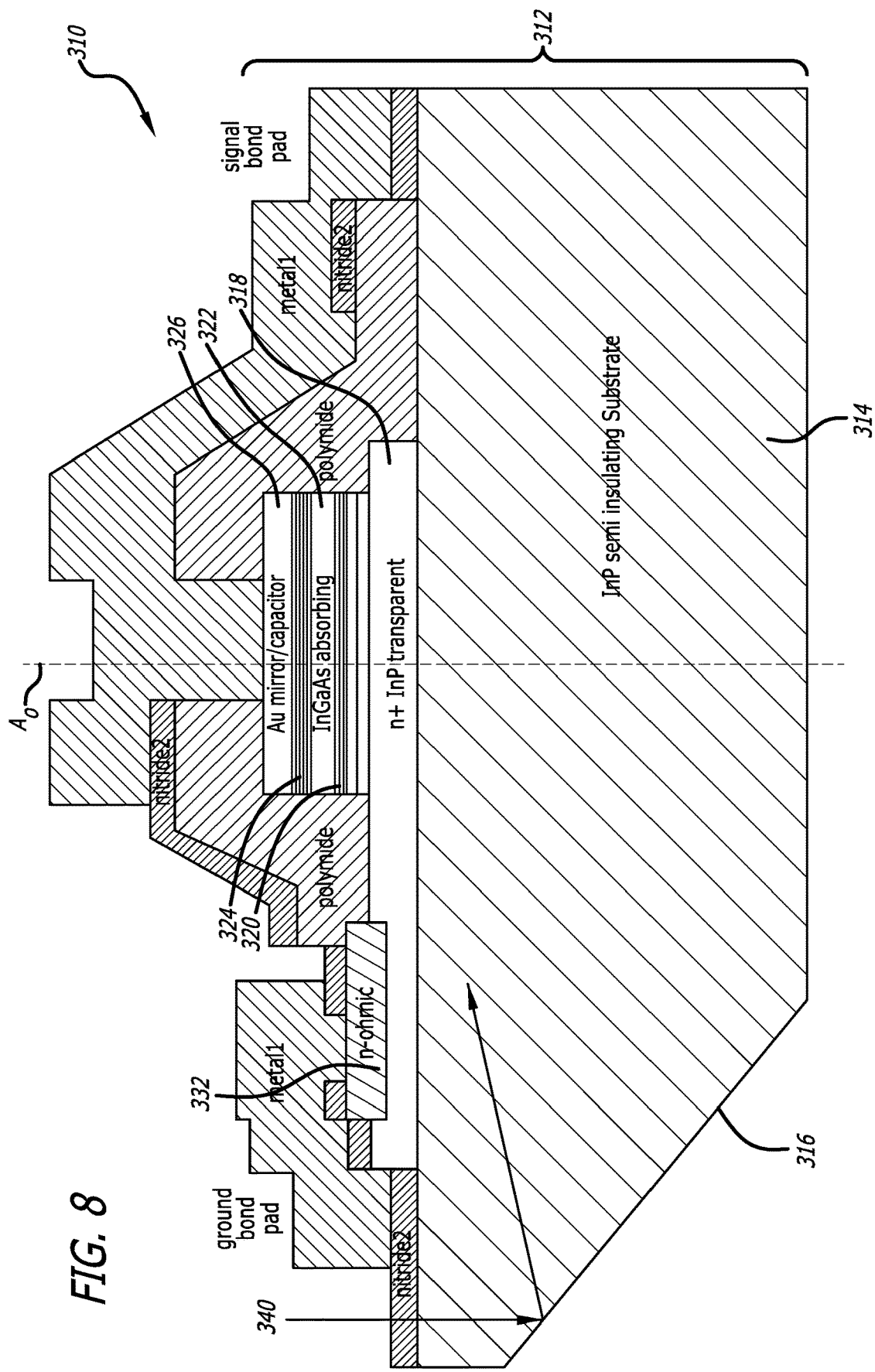
FIG. 8 shows a cross-sectional view of another embodiment of a high responsivity, high bandwidth photodiode having an angled facet formed on a substrate, the angled facet configured to reflect an incident optical signal to active layers formed on the substrate.
Figure 9:
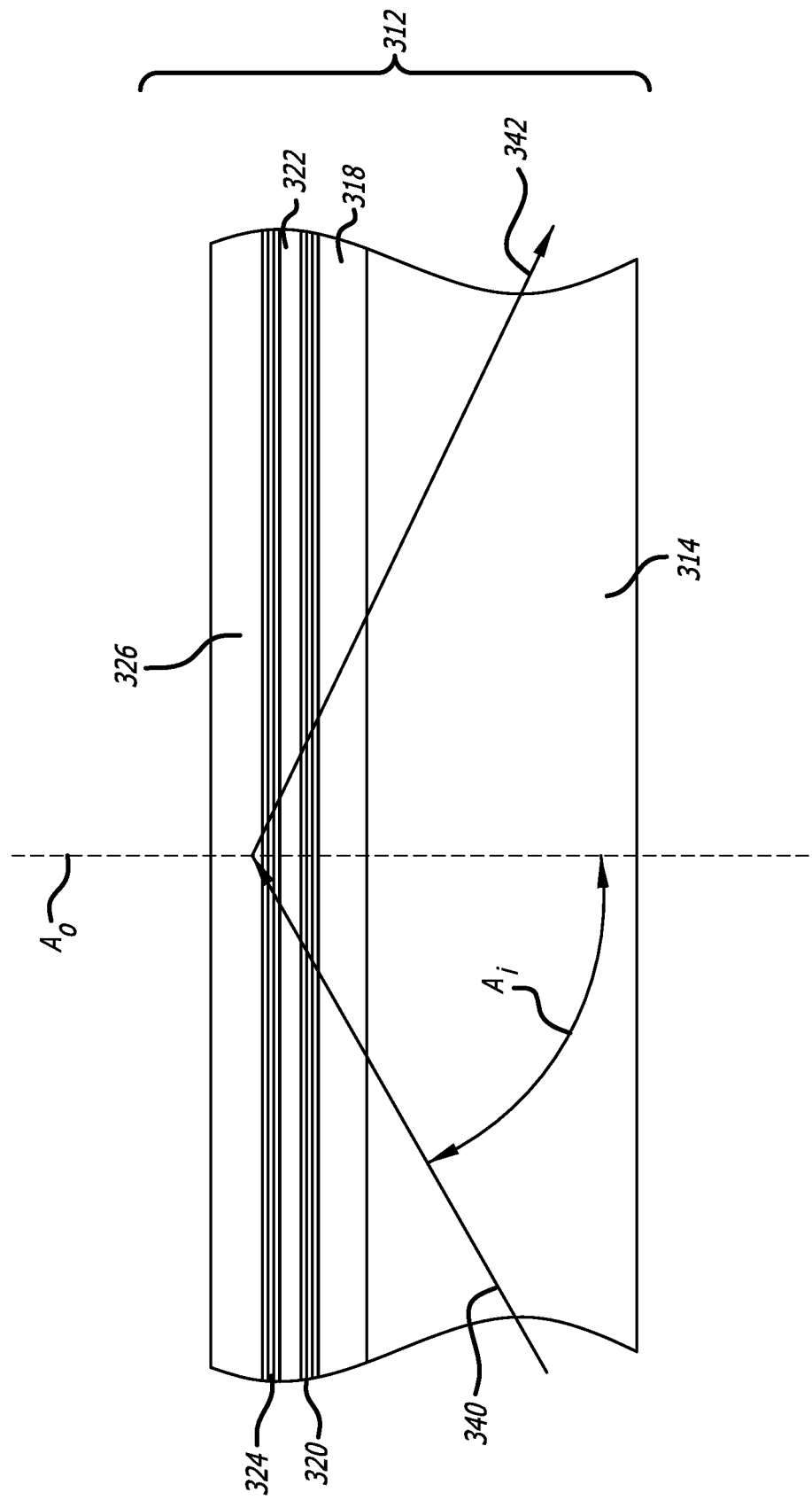
FIG. 9 shows a cross-sectional view of the various active layers of the embodiment of a high responsivity, high bandwidth photodiode shown in FIG. 8 receiving the incident optical signal at a glancing angle.

In still another embodiment, the photodiode device disclosed herein may be formed in Schottky contact architecture. More specifically, as shown in FIGS. 8 and 9 the photodiode device 310 includes a device body 312 having an angled facet 316 formed in the substrate 314. Like the previous embodiments, at least one n+ type layer 318 is positioned on or proximate to the substrate 314. In one embodiment, the n+ type layer 318 includes at least one additional material therein. Exemplary materials include, without limitations, InP and similar materials. At least one supplemental layer may be formed on the photodiode device 310. In the illustrated embodiment, the photodiode device 310 includes a first supplemental layer 320 and a second supplemental layer 324. At least one absorbing or intrinsic layer 322 may be positioned on or proximate to the supplemental layer 320. In the illustrated embodiment, the absorbing or intrinsic layer 322 may be positioned between the first supplemental layer 320 and the second supplemental layer 324, although those skilled in the art will appreciate that the absorbing or intrinsic layer 322 may be positioned anywhere within the active region with the photodiode device 310. Any variety of absorbing or intrinsic materials may be used to form the absorbing or intrinsic layer 322. At least one conductive layer 326 may be formed on or positioned proximate to second supplemental layer 324 to form the Schottky contact. Further, any variety of materials may be used to form the conductive layer 326. In one embodiment, the conductive layer 326 comprises gold, and this layer also acts as a mirror. In another embodiment, the conductive layer 326 comprises silver, aluminum, titanium, thin film materials, dielectric materials, semiconductor materials, and the like configured to be highly reflective to light at a desired wavelength. In another embodiment, the conductive layer is a conducting oxide such as the transparent conductor indium tin oxide, and device operation relies on total internal reflection at the bottom layer of the indium tin oxide.

During use, an incident optical signal 340 is reflected or refracted by the angled facet 316 of the substrate 314 forming the device body 312. In one embodiment, the angled facet 316 is configured to reflect the optical signal 340 at a large angular displacement (angle of incidence $A_i$) from optical axis (normal angle of incidence $A_o$). In one embodiment, the angle of incidence $A_i$ is less than or equal to the critical angle of total internal reflectance as determined by any of the interfaces above the absorbing layer, including the interface between the ambient atmosphere and the topmost layer. As such, the optical signal 340 traverses through the multiple layers forming the active region of the photodiode device 310 and may be reflected by at least one reflective layer 326. As a result, the reflected optical signal 342 traverses again through the active region of the photodiode device 310. Again, like the previous embodiments, the large angular displacement (angle of incidence $A_i$) of between 15° and 89° of the optical signal 340 from the normal angle of incidence (0°) results in a longer optical path length to the active material forming the photodiode device 310 as compared with an optical signal having a normal angle of incidence (0°), thereby resulting in a higher responsivity and sensitivity to incident light. Also, larger reflection coefficients at larger $A_i$ allow thin-film interference to be used to create effects such as resonant cavity enhancement, further increasing responsivity.

The embodiments disclosed herein are illustrative of the principles of the invention. Other modifications may be employed which are within the scope of the invention. Accordingly, the devices disclosed in the present application are not limited to that precisely as shown and described herein.

What is claimed:

1. A high responsivity, high bandwidth photodiode, comprising:
    at least one substrate;
    at least one n+ type layer formed on the at least one substrate and configured to receive at least a portion of at least one incident optical signal from the at least one substrate;
    at least one supplemental layer formed on the at least one n+ type layer and configured to receive at least a portion of the incident optical signal from the at least one n+ type layer;
    at least one absorbing layer formed on the at least one supplemental layer and configured to receive at least a portion of the at least one incident optical signal from the at least one supplemental layer; and
    at least one angled facet formed on the at least one substrate, the at least one angled facet configured to direct at least a portion of the at least one incident optical signal to at least one of the at least one n+ type layer, the at least one supplemental layer, and the at least one absorbing layer at an angle of incidence A, between 55° and 89° relative to an optical axis $A_o$ that normal to a surface of the at least one substrate.

2. The high responsivity, high bandwidth photodiode of claim 1 wherein the at least one substrate is manufactured from InP.

3. The high responsivity, high bandwidth photodiode of claim 1 wherein the at least one substrate is manufactured from at least one material selected from the group consisting of GaAs, Ge, and Si, GaN.

4. The high responsivity, high bandwidth photodiode of claim 1 wherein the at least one substrate has an index of refraction ranging from 3.0 to 4.5.

5. The high responsivity, high bandwidth photodiode of claim 1 wherein the at least one substrate has an index of refraction ranging from 3.10 to 3.30.

6. The high responsivity, high bandwidth photodiode of claim 1 wherein the at least one angled facet formed on the at least one substrate comprises at least one polished surface.

7. The high responsivity, high bandwidth photodiode of claim 1 wherein the one angled facet formed on the at least one substrate includes at least one anti-reflective coating applied thereto.

8. The high responsivity, high bandwidth photodiode of claim 1 wherein the at least one angled facet formed on the at least one substrate is configured to refract at least one incident optical signal to at least one of the at least one n+ type layer, at least one supplemental layer, and at least one absorbing layer.

9. The high responsivity, high bandwidth photodiode of claim 1 wherein the at least one n+ type layer has an index of refraction ranging from 2.75 to 4.00.

10. The high responsivity, high bandwidth photodiode of claim 1 wherein the at least one n+ type layer has an index of refraction ranging from 3.10 to 3.35.

11. The high responsivity, high bandwidth photodiode of claim 1 wherein the at least one n+ type layer has an index of refraction ranging from 3.25 to 3.30.

12. The high responsivity, high bandwidth photodiode of claim 1 wherein the at least one supplemental layer has an index of refraction ranging from 3.00 to 4.0.

13. The high responsivity, high bandwidth photodiode of claim 1 wherein the at least one supplemental layer has an index of refraction ranging from 3.25 to 3.75.

14. The high responsivity, high bandwidth photodiode of claim 1 wherein the at least one supplemental layer has an index of refraction ranging from 3.30 to 3.60.

15. The high responsivity, high bandwidth photodiode of claim 1 wherein the at least one supplemental layer is applied to the at least one n+ type layer and to the at least one absorbing layer.

16. The high responsivity, high bandwidth photodiode of claim 1 wherein the at least one absorbing layer has an index of refraction ranging from 3.00 to 4.00.

17. The high responsivity, high bandwidth photodiode of claim 1 wherein the at least one absorbing layer has an index of refraction ranging from 3.50 to 3.75.

18. The high responsivity, high bandwidth photodiode of claim 1 wherein the at least one absorbing layer has an index of refraction ranging from 3.60 to 3.70.

19. The high responsivity, high bandwidth photodiode of claim 1 wherein the at least one absorbing layer is manufactured from InGaAs+.

20. The high responsivity, high bandwidth photodiode of claim 1 wherein the at least one absorbing layer is manufactured from at least one material selected from the group consisting of GaAs, Ge, Si, PbSe, InAs, PbS, HgCdTe, HgCdZnTe, InAs, InSb, and AgOCs, InGaAsP, and InAlAsP.

21. The high responsivity, high bandwidth photodiode of claim 1 further comprising at least one p+ type layer formed on at least one of the at least one absorbing layer and the at least one supplemental layer, the at least one p+ type layer configured to receive at least a portion of the at least one incident optical signal from at least one of the at least one absorbing layer and the at least one supplemental layer.

22. The high responsivity, high bandwidth photodiode of claim 21 wherein the at least one p+ type layer has an index of refraction ranging from 3.00 to 3.50.

23. The high responsivity, high bandwidth photodiode of claim 21 wherein the at least one p+ type layer has an index of refraction ranging from 3.15 to 3.30.

24. The high responsivity, high bandwidth photodiode of claim 21 wherein at least one of the at least one n+ type layer, the at least one supplemental layer, and the at least one p+ type layer is manufactured from InP.

25. The high responsivity, high bandwidth photodiode of claim 21 wherein at least one of the at least one n+ type layer, the at least one supplemental layer, and the at least one p+ type layer is manufactured from InGaAsP.

26. The high responsivity, high bandwidth photodiode of claim 21 further comprising at least one additional layer applied to the at least one p+ type layer, wherein the at least one additional layer is configured to reflect the at least one incident optical signal toward the at least one absorbing layer.

27. The high responsivity, high bandwidth photodiode of claim 26 wherein the at least one additional layer has an index of refraction from 1.00 to 2.5.

28. The high responsivity, high bandwidth photodiode of claim 26 wherein the at least one additional layer comprises multiple layers of materials, wherein at least one of the at least one additional layers is manufactured from a metal.

29. The high responsivity, high bandwidth photodiode of claim 1 further comprising at least one metal layer applied to at least one of the at least one absorbing layer and at least one supplemental layer, wherein the high responsivity, high bandwidth photodiode is configured using a Schottky architecture.

30. The high responsivity, high bandwidth photodiode of claim 29 wherein the at least one metal layer comprises gold.

31. The high responsivity, high bandwidth photodiode of claim 29 wherein the at least one metal layer is selected from the group consisting of silver, copper, and conductive alloys.

32. A high responsivity, high bandwidth photodiode, comprising:
at least one substrate having an index of refraction from 3.10 to 3.35;
at least one n+ type layer formed on the at least one substrate and configured to receive at least a portion of at least one incident optical signal from the at least one substrate, the at least one n+ type layer having an index of refraction from 3.10 to 3.35;
at least one supplemental layer formed on the at least one n+ type layer and configured to receive at least a portion of the at least one incident optical signal from the at least one n+ type layer, the at least one supplemental layer having an index of refraction from 3.30 to 3.60;
at least one absorbing layer formed on the at least one supplemental layer and configured to receive at least a portion of the incident optical signal from the at least one supplemental layer, the at least one absorbing layer having an index of refraction from 3.55 to 3.75; and
at least one angled facet formed on the at least one substrate, the at least one angled facet configured to direct at least a portion of the at least one incident optical signal to at least one of the at least one n+ type layer, the at least one supplemental layer, and the at least one absorbing layer at an angle of incidence $A_i$ between 55° and 89° relative to an optical axis $A_o$ that normal to a surface of the at least one substrate.

33. A high responsivity, high bandwidth photodiode of claim 32 further comprising at least one p+ type layer applied to at least one of the at least one absorbing layer and the at least one supplemental layer, the at least one p+ type layer having an index of refraction ranging from 3.15 to 3.30, the at least one p+ type layer configured to receive at least a portion of the incident optical signal from at least one of the at least one absorbing layer and the at least one supplemental layer.

34. A high responsivity, high bandwidth photodiode of claim 32 further comprising at least one metal layer applied to at least one of the at least one absorbing layer and at least one supplemental layer, wherein the high responsivity, high bandwidth photodiode is configured using a Schottky architecture.

35. A high responsivity, high bandwidth photodiode of claim 32 further comprising at least one n-ohmic device in communication with at least one of the at least one n+ type layer and the at least one supplemental layer.

36. A high responsivity, high bandwidth photodiode of claim 32 further comprising at least one p-ohmic device in communication with at least one of the at least one p+ type layer and the at least one supplemental layer.

37. The high responsivity, high bandwidth photodiode of claim 32 wherein the at least one supplemental layer is applied to the at least one n+ type layer and to the at least one absorbing layer.

38. A high responsivity, high bandwidth photodiode, comprising:
at least one substrate having an index of refraction from 3.10 to 3.35;
at least one n+ type layer formed on the at least one substrate and configured to receive at least a portion of at least one incident optical signal from the at least one substrate, the at least one n+ type layer having an index of refraction from 3.10 to 3.35;
at least one supplemental layer formed on the at least one n+ type layer and configured to receive at least a portion of the at least one incident optical signal from the at least one n+ type layer, the at least one supplemental layer having an index of refraction from 3.30 to 3.60;
at least one absorbing layer formed on the at least one supplemental layer and configured to receive at least a portion of the at least one incident optical signal from the at least one supplemental layer, the at least one absorbing layer having an index of refraction from 3.55 to 3.75;
at least one p+ type layer applied to at least one of the at least one absorbing layer and the at least one supplemental layer, the at least one p+ type layer having an index of refraction ranging from 3.15 to 3.30; and
at least one angled facet formed on the at least one substrate, the at least one angled facet configured to direct at least a portion of the at least one incident optical signal to at least one of the at least one n+ type layer, the at least one supplemental layer, the at least one absorbing layer, and the at least one p+ type layer at an angle of incidence A, between 55° and 89° relative to an optical axis $A_o$ that normal to a surface of the at least one substrate.

39. The high responsivity, high bandwidth photodiode of claim 38 wherein the at least one supplemental layer is applied to the at least one n+ type layer and to the at least one absorbing layer.

40. A high responsivity, high bandwidth photodiode, comprising:
at least one substrate;
at least one n+ type layer formed on the at least one substrate and configured to receive at least a portion of at least one incident optical signal from the at least one substrate;
at least one supplemental layer formed on the at least one n+ type layer and configured to receive at least a portion of the at least one incident optical signal from the at least one n+ type layer;
at least one absorbing layer formed on the at least one supplemental layer and configured to receive at least a portion of the incident optical signal from the at least one supplemental layer;
at least one p+ type layer formed on at least one of the at least one absorbing layer and the at least one supplemental layer, the at least one p+ type layer configured to receive at least a portion of the at least one incident optical signal from at least one of the at least one absorbing layer and the at least one supplemental layer;

at least one additional layer applied to the at least one p+ type layer, wherein the at least one additional layer is configured to reflect the at least one incident optical signal to the at least one absorbing layer so that the at least one incident optical signal traverses through the at least one absorbing layer for at least a second time; and at least one angled facet formed on the at least one substrate, the at least one angled facet configured to direct at least a portion of the at least one incident optical signal to at least one of the at least one n+ type layer, the at least one supplemental layer, and the at least one absorbing layer at an angle of incidence A, between 55° and 89° relative to an optical axis $A_o$ that normal to a surface of the at least one substrate.

41. The high responsivity, high bandwidth photodiode of claim 40, wherein the at least one incident optical signal received by reflection from the at least one additional layer is reflected by the at least one supplemental layer so that the at least one incident optical signal traverses through the at least one absorbing layer for at least a third time.

* * * * *